(12) United States Patent
Akatsu et al.

(10) Patent No.: US 12,038,483 B2
(45) Date of Patent: Jul. 16, 2024

(54) BATTERY CONTROL DEVICE

(71) Applicant: Vehicle Energy Japan Inc., Hitachinaka (JP)

(72) Inventors: Miyuki Akatsu, Hitachinaka (JP); Keiichiro Ohkawa, Hitachinaka (JP)

(73) Assignee: VEHICLE ENERGY JAPAN INC., Hitachinaka (JP)

( * ) Notice: Subject to any disclaimer, the term of this patent is extended or adjusted under 35 U.S.C. 154(b) by 109 days.

(21) Appl. No.: 17/284,618

(22) PCT Filed: Sep. 25, 2019

(86) PCT No.: PCT/JP2019/037666
§ 371 (c)(1),
(2) Date: Apr. 12, 2021

(87) PCT Pub. No.: WO2020/075503
PCT Pub. Date: Apr. 16, 2020

(65) Prior Publication Data
US 2021/0341541 A1 Nov. 4, 2021

(30) Foreign Application Priority Data
Oct. 12, 2018 (JP) .................................. 2018-193347

(51) Int. Cl.
 *G01R 31/3842* (2019.01)
 *G01R 31/36* (2020.01)
 (Continued)

(52) U.S. Cl.
 CPC ..... *G01R 31/3842* (2019.01); *G01R 31/3648* (2013.01); *G01R 31/388* (2019.01);
 (Continued)

(58) Field of Classification Search
None
See application file for complete search history.

(56) References Cited

U.S. PATENT DOCUMENTS

| | | | |
|---|---|---|---|
| 2005/0154544 A1* | 7/2005 | Ono | G01R 31/3828 702/63 |
| 2014/0055100 A1* | 2/2014 | Igarashi | H02J 7/00 320/152 |

(Continued)

FOREIGN PATENT DOCUMENTS

| | | | | |
|---|---|---|---|---|
| CN | 104578241 A | | 4/2015 | |
| JP | 2007193698 | * | 2/2007 | ............ G06F 7/485 |
| JP | 2008-145349 A | | 6/2008 | |

OTHER PUBLICATIONS

International Search Report issued in international application No. PCT/JP2019/037666 dated Dec. 3, 2019.
(Continued)

*Primary Examiner* — Brent A. Fairbanks
(74) *Attorney, Agent, or Firm* — FOLEY & LARDNER LLP

(57) ABSTRACT

A battery control unit has an SOCv operation unit which calculates a state of charge SOCv based on voltage of a battery, a ΔSOCi operation unit which calculates an amount of change ΔSOCi of the state of charge based on current value of the battery, a weight operation unit which calculates a weight W, and an SOCc operation unit which calculates a final SOC (SOCc) based on the SOCv, the ΔSOCi and the weight W. Terms forming an operational expression of the SOCc are retained, by using a determination threshold, as a sum SOCc_Big of terms of a large value group and a sum SOCc_Small of terms of a small value group, and used in calculating the SOCc of a subsequent operation period. By using the SOCc_Big and the SOCc_Small, it is possible to prevent the accumulation of errors caused by information loss that occurred when repeatedly operating the SOCc.

11 Claims, 7 Drawing Sheets

(51) Int. Cl.
*G01R 31/3828* (2019.01)
*G01R 31/388* (2019.01)
*H01M 10/48* (2006.01)
*H02J 7/00* (2006.01)

(52) U.S. Cl.
CPC ......... *H01M 10/48* (2013.01); *H01M 10/482* (2013.01); *H02J 7/0013* (2013.01); *G01R 31/3828* (2019.01)

(56) References Cited

U.S. PATENT DOCUMENTS

| | | | | |
|---|---|---|---|---|
| 2014/0167656 A1* | 6/2014 | Yamada | ............. | G01R 31/3842 320/134 |
| 2015/0134282 A1* | 5/2015 | Soga | ..................... | H01M 10/48 702/63 |
| 2015/0185290 A1* | 7/2015 | Watanabe | ............ | G01R 31/392 702/63 |
| 2015/0301115 A1* | 10/2015 | Ohkawa | ................ | H02J 7/0013 324/426 |
| 2017/0117587 A1* | 4/2017 | Sugeno | ................ | H01M 10/48 |

OTHER PUBLICATIONS

Office Action dated May 11, 2023 issued in CN Patent Application No. 201980067165.1, with English Machine Translation, 10 pages.

\* cited by examiner

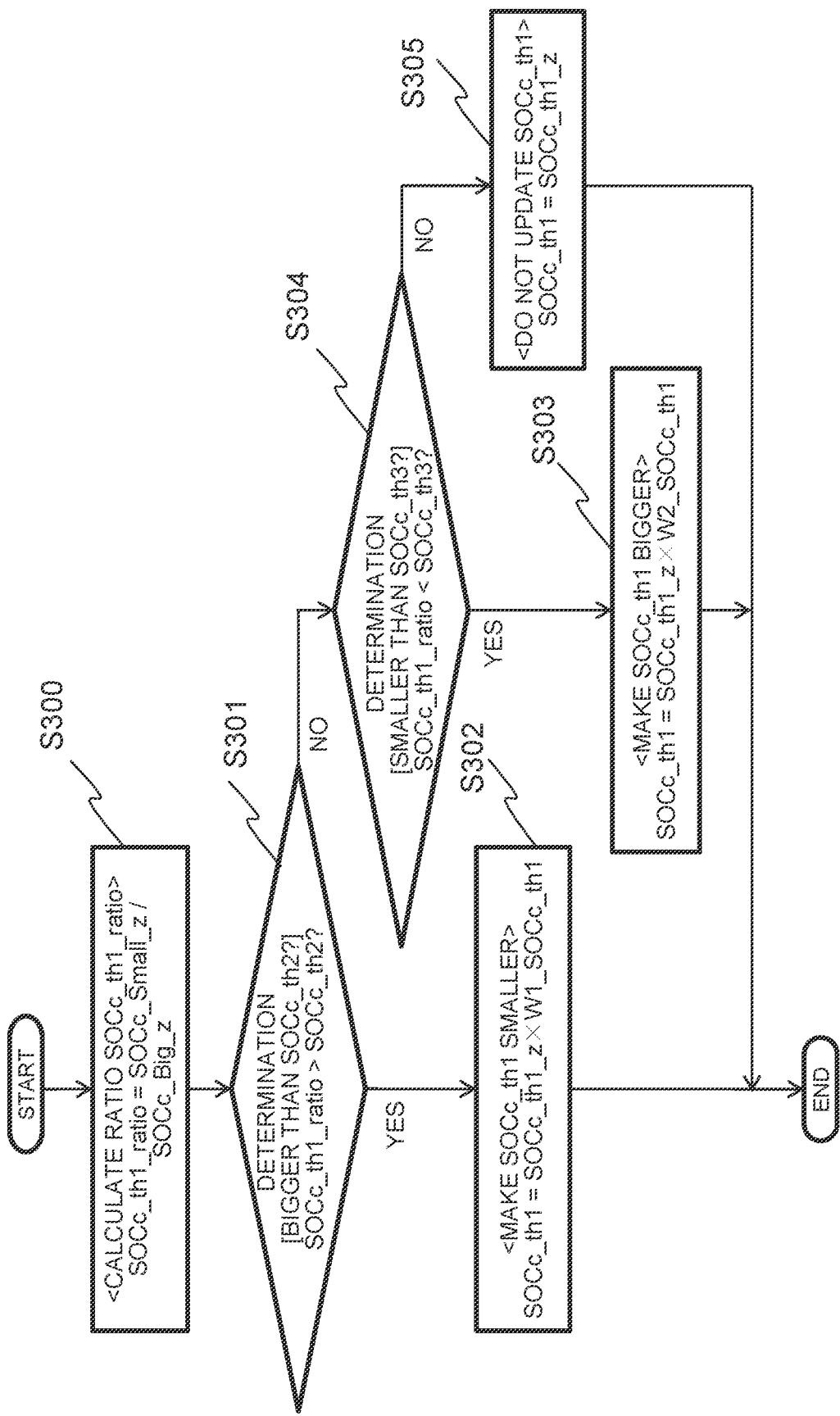

BATTERY CONTROL DEVICE

TECHNICAL FIELD

The present invention relates to a battery control device.

BACKGROUND ART

In order to utilize a secondary battery such as a lithium ion battery or a nickel hydride battery to the maximum extent, it is necessary to accurately estimate the state of charge (SOC) of the secondary battery. Estimation of the SOC is generally performed by retaining a previously estimated SOC, and using the retained SOC in performing operations. PTL 1 describes a method of retaining previous SOCs obtained at a plurality of timings, selecting a plurality of retained SOCs, and using the selected SOCs in the operation of the current SOC.

CITATION LIST

Patent Literature

[PTL 1] Japanese Unexamined Patent Application Publication No. 2008-145349

SUMMARY OF THE INVENTION

Problems to be Solved by the Invention

Nevertheless, when operating the current SOC by using previous SOCs, if the size of the value to be handled between a minute increase/decrease amount of the SOC and the previous integrated quantities of the SOCs is considerably different, there was a problem in that the minute value of the SOC is ignored and information loss occurs, and the operation of the SOC is not performed correctly.

Means to Solve the Problems

The battery control device according to the present invention comprises a first operation unit which divides an operation of a state of charge of a battery into a plurality of terms and operates each term, a second operation unit which divides an operation result of each term operated by the first operation unit into a plurality of groups based on a predetermined threshold and totals the operation result for each group, and a storage unit which respectively stores, as previous values, the operation result for each group totaled in a previous operation period by the second operation unit, wherein the first operation unit operates each term using the previous value of each group stored in the storage unit.

Advantageous Effects of the Invention

According to the present invention, it is possible to suppress the operational error of the SOC caused by information loss.

BRIEF DESCRIPTION OF DRAWINGS

FIG. 7 is a flowchart showing the processing of the threshold operation unit in the third embodiment.

DESCRIPTION OF EMBODIMENTS

First Embodiment

The first embodiment is now explained with reference to FIG. 1 to FIG. 4.

Figure 1:
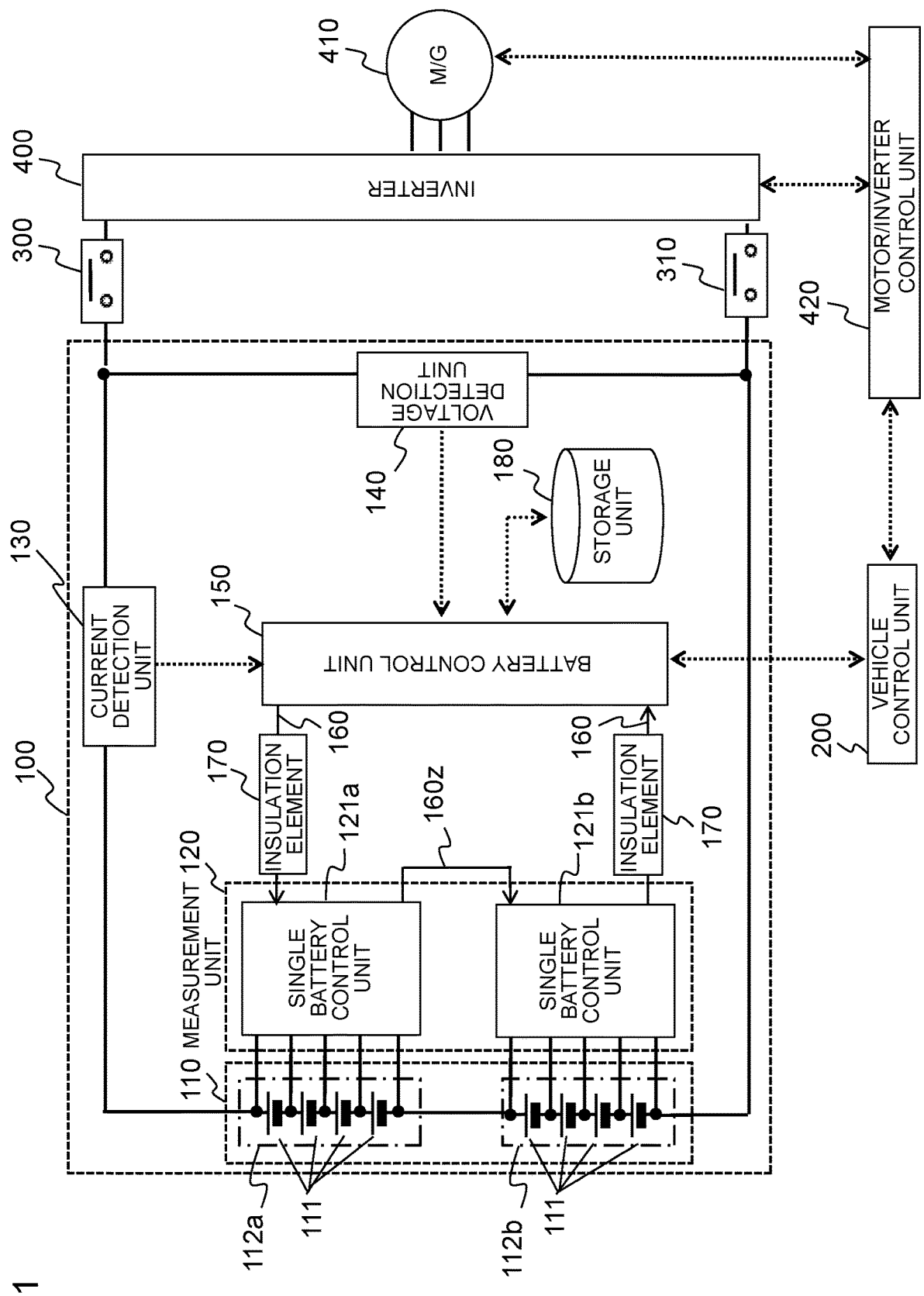
FIG. 1 is a block diagram showing the configuration of the battery system.

FIG. 1 is a block diagram showing the configuration of the battery system. The battery system 100 is a system which supplies power to an outside supply target, and the supply target is, for example, an electric vehicle, a hybrid vehicle, a train or an industrial apparatus. FIG. 1 shows an example of supplying power to a motor generator 410 for driving a hybrid vehicle.

The battery system 100 is connected to an inverter 400 via relays 300, 310. The inverter 400 supplies power from the battery system 100 to the motor generator 410. The inverter 400 and the motor generator 410 are controlled by a motor/inverter control unit 420. The vehicle control unit 200 decides the distribution of the driving force based on battery information obtained with the battery system 100, information from the inverter 400 and the motor generator 410, and information from an engine not shown.

The battery system 100 comprises an assembled battery 110 configured from a plurality of single batteries 111, a measurement unit 120 comprising a plurality of single battery control units 121 which monitor a state of the single batteries 111, a current detection unit 130 which detects a current flowing through the assembled battery 110, a voltage detection unit 140 which detects a total voltage of the assembled battery 110, a battery control unit 150 which controls the assembled battery 110, and a storage unit 180 which stores information related to the battery characteristics of the assembled battery 110, the single battery 111 and the single battery group 112.

The plurality of single batteries 111 configuring the assembled battery 110 are grouped into a predetermined number of units. In the example shown in FIG. 1, a plurality of single batteries 111 are grouped into two single battery groups 112a, 112b. The single battery groups 112a, 112b are electrically connected in series.

Note that the single battery 111 is a rechargeable battery such as a lithium ion secondary battery. As the single battery 111, otherwise used may be a nickel hydride battery, a lead battery, a storage battery such as an electric double-layer capacitor, or a device comprising a storage function. Here, while a one-cell battery is considered as the single battery 111, the single battery 111 may also adopt a configuration substituted with a module structure in which a plurality of batteries are connected in multiple series or connected in parallel.

Moreover, while the example of FIG. 1 shows a configuration in which two single battery groups 112a, 112b are connected in series as the assembled battery 110, the configuration is not limited thereto, and a predetermined number of single battery groups may be connected in series or connected in parallel. Moreover, the present invention may also be configured by combining various number of series connections or parallel connections according to the usage.

The measurement unit 120 monitors the state of each single battery 111 configuring the assembled battery 110, and the same number of single battery control units 121a, 121b are provided in correspondence with a plurality of single battery groups 112a, 112b. The single battery control unit 121a is assigned to the single battery group 112a, and the single battery control unit 121b is assigned to the single battery group 112b. The single battery control units 121a, 121b each operate by receiving power from the single battery groups 112a, 112b that are respectively assigned to the single battery control units 121a, 121b. The single battery control units 121a, 121b monitor the battery voltage and the battery temperature of the single battery groups 112a, 112b that are respectively assigned to the single battery control units 121a, 121b.

A value of a current flowing through the assembled battery 110 sent from the current detection unit 130 and a total voltage value of the assembled battery 110 sent from the voltage detection unit 140 are input to the battery control unit 150. Moreover, the battery control unit 150 sends and receives signals to and from the measurement unit 120 based on the signal communication unit 160, and receives, from the measurement unit 120, the battery voltage and the battery temperature of the single battery 111, as well as the diagnosis regarding whether the single battery 111 is overcharged or over discharged, and abnormal signals output when a communication error occurs in the measurement unit 120. The battery control unit 150 performs processing of estimating the state of charge (SOC) of the assembled battery 110 based on the input information, and sends the processing result to the measurement unit 120 and the vehicle control unit 200.

With the battery control unit 150, the arithmetic operation processing of the estimation operation of states such as the state of charge SOC and the state of health SOH is performed based on a 32-bit floating point. When operation is performed using a fixed point, the numerical value range that can be expressed is narrow and an arithmetic overflow or arithmetic underflow will occur, but when a floating point is used, since the numerical value range that can be expressed is wide, the risk of a problem occurring can be reduced. While the effective digits that can be expressed with a 32-bit floating point is less than a 64-bit floating point, since the memory usage of the 32-bit floating point is ½ of the 64-bit floating point, the memory can be conserved in comparison to the 64-bit floating point. While a 32-bit floating point is used in this embodiment, any bit number may be used so long as it is a floating point, and there is no limit in the bit number to be used in the operation.

Note that the signal communication unit 160 is provided with an insulation element 170 such as a photocoupler. While the measurement unit 120 operates by receiving power from the assembled battery 110 as described above, since the battery control unit 150 uses an in-vehicle auxiliary battery (such as a 12V-system battery) as its power source, the reference potential of the operating power source of the battery control unit 150 and the measurement unit 120 is different. The insulation element 170 is thereby provided to the signal communication unit 160. The insulation element 170 may be mounted on a circuit board configuring the measurement unit 120, or may be mounted on a circuit board configuring the battery control unit 150. Note that the insulation element 170 may be omitted depending on the system configuration.

The single battery control units 121a, 121b are connected in series in descending order of the potential of the single battery groups 112a, 112b that are respectively monitored by the single battery control units 121a, 121b. While the insulation element 170 is not provided between an output of the single battery control unit 121a and an input of the single battery control unit 121b, this is because the single battery control units 121a, 121b are provided with a scheme which enables communication even between different operating reference potentials. However, when electrical insulation is required for the communication between the single battery control unit 121a and the single battery control unit 121b, the insulation element 170 needs to be provided.

The signals sent by the battery control unit 150 are input to the single battery control unit 121a by the signal communication unit 160 provided with the insulation element 170. The output signals from the single battery control unit 121b are transmitted to the input unit of the battery control unit 150 by the signal communication unit 160 provided with the insulation element 170. Accordingly, the battery control unit 150 and the single battery control units 121a, 121b are connected in a loop by the signal communication unit 160. While this kind of connection and communication method is known as a daisy chain connection, it is also sometimes referred to as "juzu tsunagi setuzoku" or "imozuru setuzoku" in Japanese.

The storage unit 180 stores information related to the assembled battery 110, the single battery 111 and the single battery group 112 such as the internal resistance characteristics, capacity at full charge, polarization resistance characteristics, degradation characteristics, individual difference information, and correspondence relation (OCV-SOC map) of the open circuit voltage OCV of the battery and the state of charge SOC of the battery. Note that, while the example of FIG. 1 shows a configuration where the storage unit 180 is disposed outside the battery control unit 150 and the measurement unit 120, the configuration may also be such that the storage unit 180 is provided inside the battery control unit 150 or the measurement unit 120.

Figure 2:
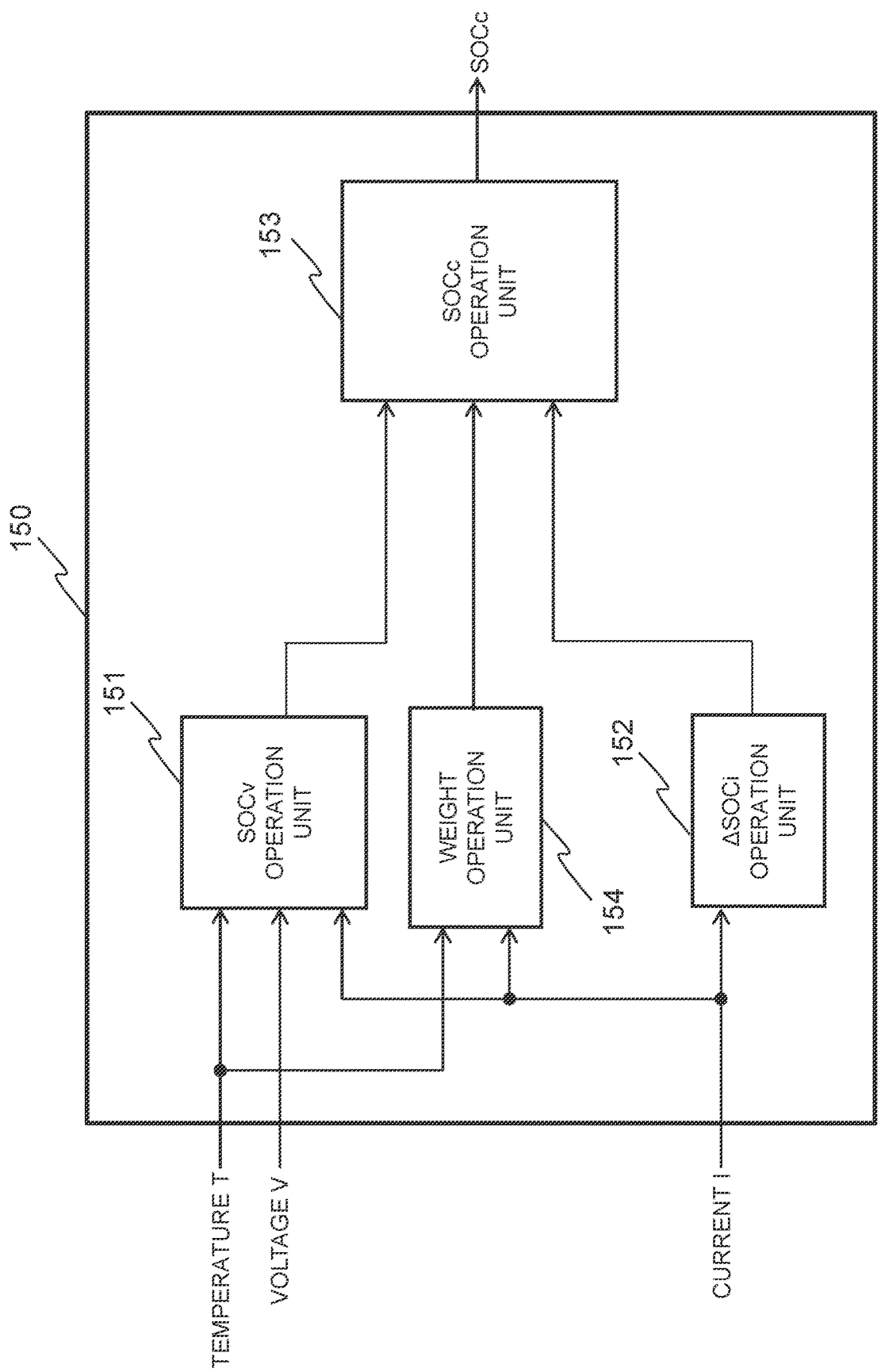
FIG. 2 is a block diagram showing the configuration of the battery control unit.

FIG. 2 is a block diagram showing the configuration of the battery control unit 150. The battery control unit 150 comprises an SOCv operation unit 151, a ΔSOCi operation unit 152, an SOCc operation unit 153, and a weight operation unit 154.

Input to the SOCv operation unit 151 are a voltage V of the single battery 111 (average voltage of each single battery 111) configuring the assembled battery 110, a current I flowing through the assembled battery 110, and a temperature T obtained with the assembled battery 110. Here, the voltage V of the single battery 111 that is input is an average voltage of the voltages of a plurality of single batteries 111 included in the assembled battery 110. The SOCv operation unit 151 operates and outputs the state of charge SOCv of the battery based on the battery voltage V.

Input to the ΔSOCi operation unit 152 is a current I flowing through the assembled battery 110. The ΔSOCi operation unit 152 calculates an increase/decrease amount ΔSOCi of a current integration obtained by time-integrating the current flowing through the assembled battery 110 from a previous operation period. The ΔSOCi is added to the state of charge SOC (SOCc described later) of the battery of the previous operation period in the SOCc operation unit 153, and the SOCi based on the current integration is thereby calculated.

Input to the weight operation unit 154 are a current flowing through the assembled battery 110, and a temperature obtained with the assembled battery 110. When the SOCv can be accurately acquired, the weight operation unit 154 calculates the weight W as a large value, and changes the weight W so as to increase the specific weight of the state of charge SOCv relative to the state of charge SOCc. Moreover, when the accuracy of the state of charge SOCv cannot be obtained, the weight W is decreased in order to increase the specific weight of the operation based on the state of charge SOCi.

Generally speaking, the state of charge SOCv is characterized in that the SOC estimation error is small when the current is stable, such as when the current flowing through the assembled battery 110 is zero or a constant current continues for a given period of time or longer, and the SOC estimation error contrarily tends to be great when the fluctuation of the current is severe or when the battery temperature is a low temperature. Meanwhile, the state of charge SOCi is characterized in that the SOC estimation error is small when the current is large and there is no steep fluctuation, and the SOC estimation error contrarily tends to be great when the current value is small and susceptible to the measurement accuracy of the current detection unit 130.

Thus, the weight operation unit 154 and the SOCc operation unit 153 adjust the influence on the final state of charge SOCc based on the weight W relative to the characteristics of the state of charge SOCv and the state of charge SOCi described above. It is thereby possible to improve the SOC estimation accuracy.

The SOCc operation unit 153 operates and outputs the final state of charge SOC (this is hereinafter referred to as "SOCc") of the battery that is more probable from the state of charge SOCv as the output of the SOCv operation unit 151, the state of charge increase/decrease amount ΔSOCi from a previous operation period as the output of the ΔSOCi operation unit 152, and the weight W as the output of the weight operation unit 154. Details of the SOCc operation unit 153 will be described later with reference to FIG. 3.

(Basic Formulas of SOCv, ΔSOCi, and SOCc)

The basic formulas of the operation performed by the SOCc operation unit 153 in this embodiment are now explained.

Formula (1) shows the basic formula of the state of charge SOCc, the state of charge SOCv, the state of charge SOCi, and the weight W. When the weight W of Formula (1) is changed between 0 and 1, the ratio of SOCv and SOCi relative to the state of charge SOCc can be adjusted. When W is changed to be smaller, SOCc becomes an SOCi overestimation. Moreover, when W is changed to be greater, SOCc becomes an SOCv overestimation.

$$SOCc = W \times SOCv + (1-W) \times SOCi \quad \text{Formula (1)}$$

Subsequent Formula (2) is the SOCi calculation formula in this embodiment. The SOC state of charge SOCi based on a current integration can be obtained by adding the amount of change ΔSOCi of the state of charge from the previous operation period and the SOC up to the previous operation period (this is hereinafter referred to as "SOCc_z").

$$SOCi = \Delta SOCi + SOCc\_z \quad \text{Formula (2)}$$

Formula (3) is a modified formula of Formula (1) obtained by substituting Formula (1) with Formula (2). SOCv, ΔSOCi, and SOCc that appear in Formula (3) respectively correspond to the outputs of the SOCv operation unit 151, the ΔSOCi operation unit 152, and the SOCc operation unit 153 of FIG. 2.

$$SOCc = W \times SOCv + (1-W) \times (\Delta SOCi + SOCc\_z) \quad \text{Formula (3)}$$

As explained above, with the SOCc operation unit 153 in this embodiment, the SOCc is calculated based on Basic Formula (3). Since Basic Formula (3) is a separate expression formula of Basic Formula (1), it can be understood that it is the equivalent processing as Formula (1). Note that, in this embodiment, while the battery control unit 150 is configured from the SOCv operation unit 151, the ΔSOCi operation unit 152, and the SOCc operation unit 153, they do not need to be independent operation units, and, if the same processing as Basic Formula (3) is performed using SOCv and ΔSOCi, one operation unit may be used to perform such processing. Moreover, without limitation to one operation unit, the processing may be performed by being divided into a plurality of operation units. In this embodiment, the SOCc operation unit 153 modifies Basic Formula (3) as described later and derives seven SOCc terms from the SOCc and performs an SOCc operation based on Basic Formula (3).

Note that, while the flowcharts processed by the SOCc operation unit 153 will be described later, the program shown with these flowcharts can be executed with a computer comprising a CPU, a memory and the like. All of the processing or a part of the processing may also be realized with a hard logic circuit. Furthermore, this program may be stored in advance in the battery control unit 150 or the storage medium of the storage unit 180, and then provided. Otherwise, the program may be stored in an independent storage medium and then provided, or the program may be recorded and stored in the battery control unit 150 or the storage medium of the storage unit 180 via a network line. The program may also be supplied as a computer readable computer program product in various forms, such as in the form of data signals (carrier waves).

(Information Loss of Basic Formula (3))

Information loss of Basic Formula (3) is now explained. Formula (3) includes the operation of (1−W). Here, when performing the SOC operation of the SOCi overestimation, there are cases where the weight W becomes an extremely small value. In the foregoing case, as a result of performing the subtraction of (1−W), an operational error caused by information loss will occur. This operational error becomes an error of SOCc in the present operation period. In the subsequent operation period, since the SOCc of the subsequent operation period is calculated with the SOCc containing the previous error as the input, the errors become accumulated. Thus, conventionally, in the SOCc operation of Formula (3), by retaining the SOCc of the previous operation period and using the SOC operation of the present operation period, an error caused by information loss resulting from the operation of (1−W) occurred and accumulation of errors caused by the SOCc of the previous operation period (this is hereinafter referred to as "SOCc_z") occurred.

(Explanation of SOCc Operation Unit 153)

Figure 3:
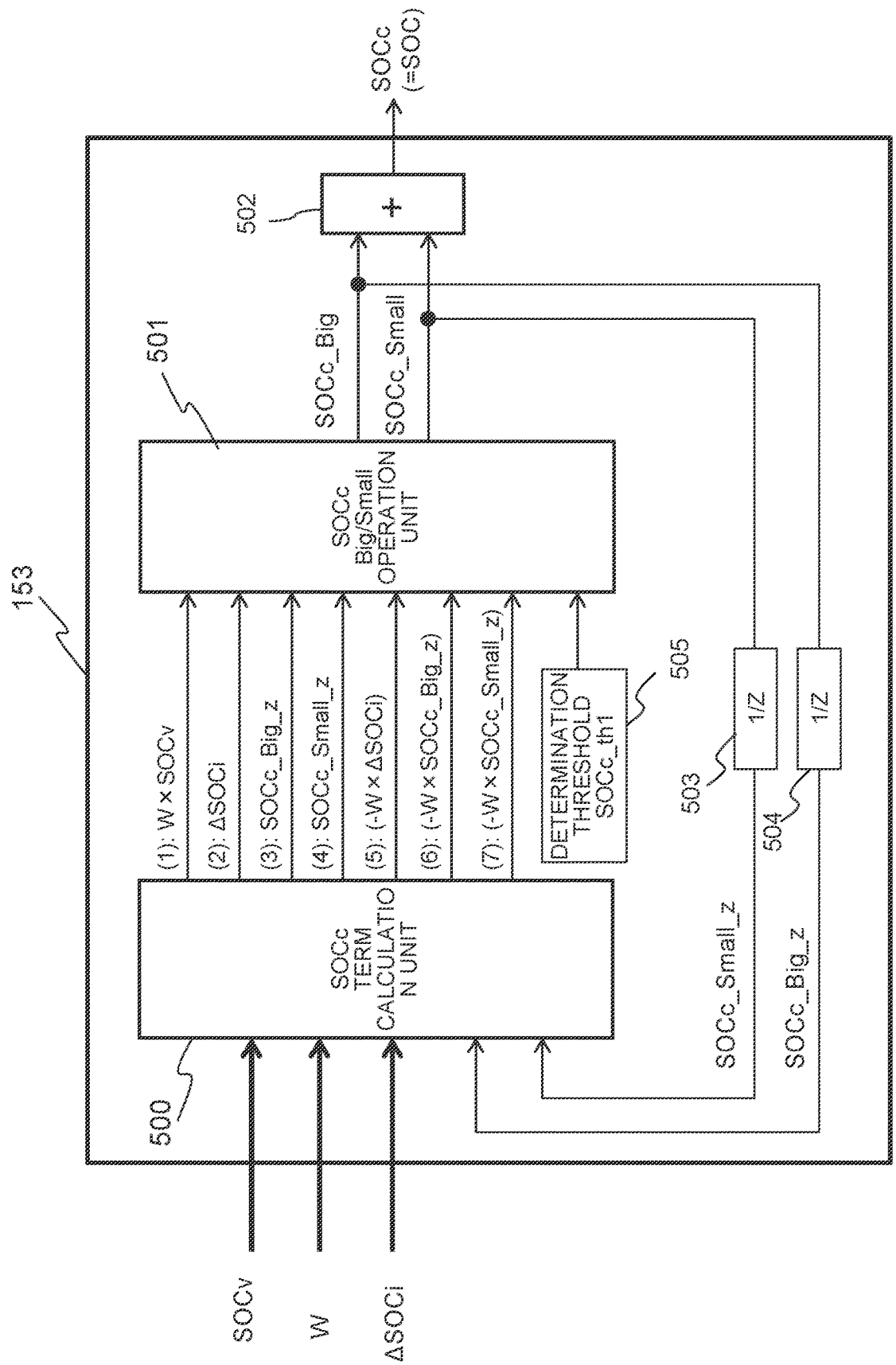
FIG. 3 is a block diagram of the SOCc operation unit in the first embodiment.

FIG. 3 is a block diagram of the SOCc operation unit 153 of this embodiment. The SOCc operation unit 153 comprises an SOCc term calculation unit 500, an SOCc Big/Small operation unit 501, an addition unit 502, previous value holding units 503, 504, and a determination threshold storage unit 505, and calculates the SOCc, which is the final SOC, with SOCv, ΔSOCi, and weight W as the inputs. Note that the previous value holding units 503, 504 and the determination threshold storage unit 505 may be provided inside the storage unit 180, and the previous value holding units 503, 504 and the determination threshold storage unit 505 may be configured from a non-volatile memory.

SOCc_Big and SOCc_Small are now explained. The SOCc can be expressed with a sum of a plurality of operands. Among the plurality of operands, when large value terms are deemed a Big group and the sum thereof is expressed as SOCc_Big and small value terms are deemed a Small group and the sum thereof is expressed as SOCc_Small, the relational expression of Formula (4) is obtained.

$$SOCc = SOCc\_Big + SOCc\_Small \quad \text{Formula (4)}$$

SOCc_Big and SOCc_Small are respectively the sum of terms having approximate values. Since information loss occurs when adding or subtracting extremely big values and extremely small values, when operation is performed by being divided into SOCc_Big and SOCc_Small, information loss error will not occur, or information loss error will be minimal. This relation is the same in the SOCc (SOCc_z) of the previous operation period, and Formula (5) can thereby be obtained. SOCc_Big_z and SOCc_Small_z of Formula (5) respectively express SOCc_Big and SOCc_Small of the previous operation period.

$$SOCc\_z = SOCc\_Big\_z + SOCc\_Small\_z \quad \text{Formula (5)}$$

When the SOCc of Formula (3) is modified based on the derivation of Formula (5), Formula (6) can be obtained. Formula (6) is a formula that does not use SOCc_z, which contains an information loss error, as an operand, and expressed with SOCc_Big_z and SOCc_Small_z with minimal information loss error.

$$SOCc = W \times SOCv + (1-W) \times (\Delta SOCi + SOCc\_Big\_z + SOCc\_Small\_z) \quad \text{Formula (6)}$$

Formula (6) can additionally be modified as shown in Formula (7). Formula (7) is a formula expressed with seven SOCc terms, and the individual operation results of each SOCc term do not include any addition or subtraction which causes information loss.

$$SOCc = W \times SOCv + \Delta SOCi + SOCc\_Big\_z + SOCc\_Small\_z + (-W \times \Delta SOCi) + (-W \times SOCc\_Big\_z) + (-W \times SOCc\_Small\_z) \quad \text{Formula (7)}$$

Here, if the operation results of each of the seven SOCc terms obtained from Formula (7); that is, (1) $W \times SOCv$, (2) $\Delta SOCi$, (3) $SOCc\_Big\_z$, (4) $SOCc\_Small\_z$, (5) $(-W \times \Delta SOCi)$, (6) $(-W \times \Delta SOC\_Big\_z)$, and (7) $(-W \times \Delta SOC\_Small\_z)$ can be allocated to large value terms and small value terms based on a determination threshold SOCc_th1, SOCc_Big and SOCc_Small can be expressed as shown in Formula (8) and Formula (9) below.

SOCc_Big=Among (1) to (7) SOCc terms, sum of large value terms equal to or greater than determination threshold SOCc_th1     Formula (8)

SOCc_Small=Among (1) to (7) SOCc terms, sum of small value terms less than determination threshold SOCc_th1     Formula (9)

Moreover, by retaining SOCc_Big and SOCc_Small obtained in the present operation period and enabling such SOCc_Big and SOCc_Small to be referenced in the subsequent operation period, SOCc_Big_z and SOCc_Small_z can be obtained in the subsequent operation period.

SOCc_Big_z=SOCc_Big of previous operation period     Formula (10)

SOCc_Small_z=SOCc_Small of previous operation period     Formula (11)

The SOCc term calculation unit 500 of FIG. 3 uses SOCv, $\Delta SOCi$, weight W, SOCc_Big_z corresponding to Formula (10), and SOCc_Small_z corresponding to Formula (11) as the inputs, and outputs the operation results of the seven SOCc terms obtained from Formula (7); that is, (1) $W \times SOCv$, (2) $\Delta SOCi$, (3) $SOCc\_Big\_z$, (4) $SOCc\_Small\_z$, (5) $(-W \times \Delta SOCi)$, (6) $(-W \times \Delta SOC\_Big\_z)$, and (7) $(-W \times \Delta SOC\_Small\_z)$.

The SOCc Big/Small operation unit 501 outputs SOCc_Big and SOCc_Small with the operation results of the SOCc terms of (1) to (7) of the SOCc term calculation unit 500 and the output SOCc_th1 of the determination threshold storage unit 505 as the inputs. Note that the operation performed by at least one of either the SOCc term calculation unit 500 or the SOCc Big/Small operation unit 501 includes a floating-point operation as described above.

Figure 4:
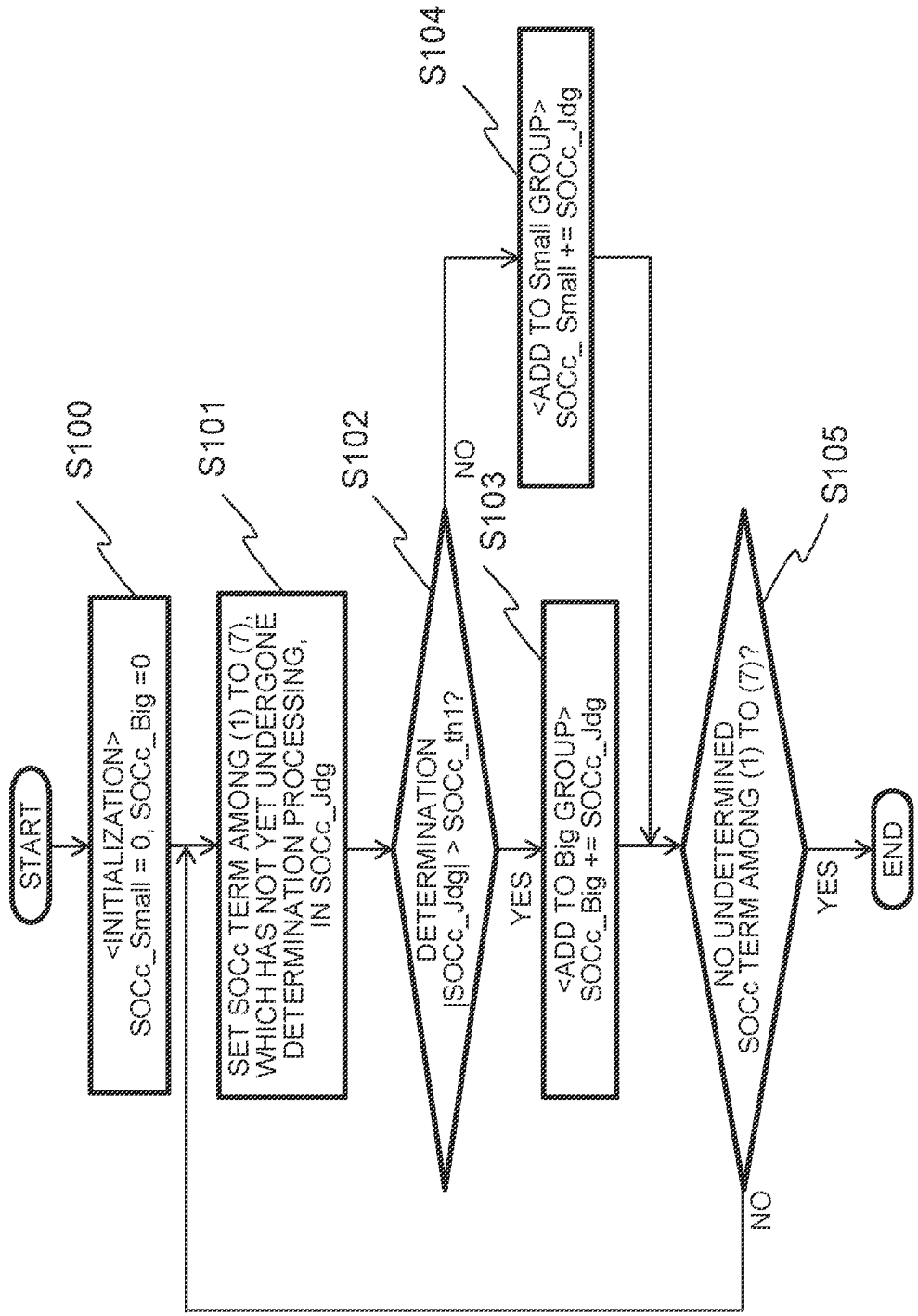
FIG. 4 is a flowchart showing the processing of the SOCc Big/Small operation unit in the first embodiment.

FIG. 4 is a flowchart showing the processing of the SOCc Big/Small operation unit 501. In step S100, an initial value is assigned to SOCc_Big and SOCc_Small. In step S101, an SOCc term that has not yet undergone determination processing among the respective SOCc terms is assigned to a determination target SOCc_Jdg. In step S102, the determination target SOCc_Jdg is compared with the determination threshold SOCc_th1 and the size is determined. In other words, if SOCc_Jdg>SOCc_th1, the value of SOCc_Jdg is added to SOCc_Big in step S103. If SOCc_Jdg<=SOCc_th1, the value of SOCc_Jdg is added to SOCc_Small in step S104. In step S105, whether there is any undetermined SOCc term (SOCc term that has not yet undergone determination processing) among the seven SOCc terms (1) to (7) is determined. If there is an undetermined SOCc term, steps S101 to S105 are repeated to the undetermined term. Moreover, when there is no longer any undetermined term, the processing is ended. Accordingly, by determining the size of the seven SOCc terms (1) to (7) and dividing them into two groups and totaling the respective SOCc terms included in each of these two groups for each group, SOCc_Big and SOCc_Small can be calculated.

SOCc_Big and SOCc_Small as outputs of the SOCc Big/Small operation unit 501 are respectively retained in the previous value holding units 503 and 504. The retained values are used as SOCc_Big_z and SOCc_Small_z in the subsequent operation period. Here, as SOCc_Big_z and SOCc_Small_z, the values stored in a non-volatile memory equipped in the storage unit 180 as previous values may also be used in addition to the retained values periodically operated in succession. By storing the previous values in a non-volatile memory when terminating the use of the vehicle and using the previous values stored when terminating the use of the vehicle as the SOC of the previous operation period upon activating the vehicle, such previous values can be used when normal SOC operation could not be performed upon activating the vehicle. This is because the decrease of the SOC is small in circumstances where a battery such as the assembled battery 110 is not being used, and it is an SOC that is close to the operation result of the SOC that can be acquired at the time of activation.

Returning to the explanation of FIG. 3, the addition unit 502 calculates the SOCc by taking the sum of SOCc_Big and SOCc_Small corresponding to Formula (4). Note that the addition unit 502 may also take the sum of the respective SOCc terms based on Formula (7) without limitation to the example of taking the sum of SOCc_Big and SOCc_Small. Accordingly, it is possible to limit the addition or subtraction, which causes information loss, to the single addition or subtraction performed by the addition unit 502 for calculating the SOCc.

In this embodiment, SOCc_Big and SOCc_Small, which have minimal information loss, are calculated, SOCc_Big and SOCc_Small are respectively retained, and used as SOCc_Big_z and SOCc_Small_z in the subsequent operation period. Consequently, by using SOCc_Big_z and SOCc_Small_z with minimal error caused by information loss as the previous values of the SOC for use in the subsequent operation period rather than the SOCc containing an error due to information loss, it is possible to prevent the accumulation of errors caused by information loss which occurred during the repeated SOCc operations. Moreover, when calculating the final SOC (SOCc), the operation of big values and small values, which causes information loss, can be reduced to a minimum number of times (once) such as by taking the sum of SOCc_Big and SOCc_Small.

Second Embodiment

Figure 5:
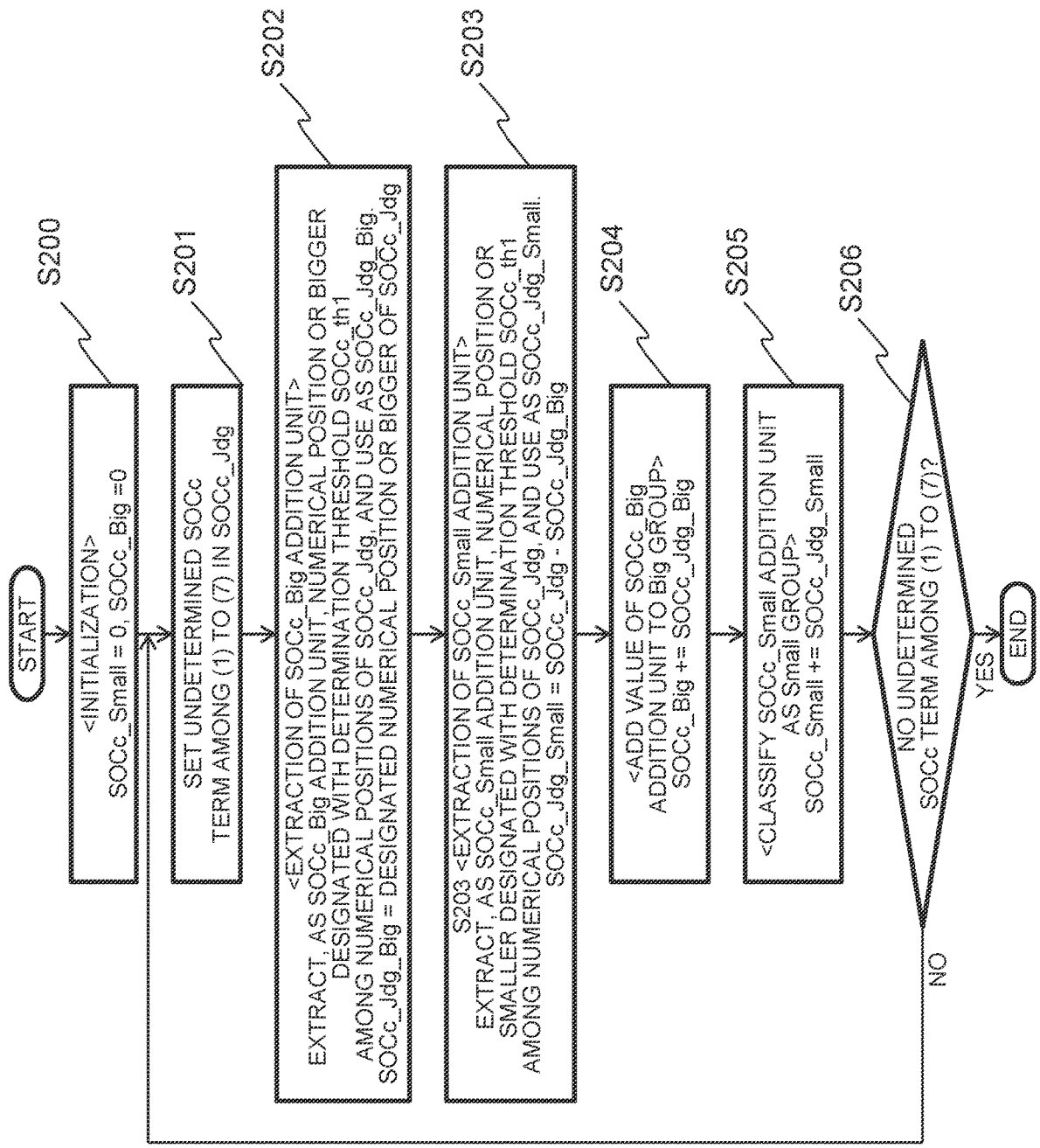
FIG. 5 is a flowchart showing the processing of the SOCc Big/Small operation unit in the second embodiment.

The second embodiment is now explained. Since the block diagram of the configuration of the battery system shown in FIG. 1, the block diagram of the battery control unit shown in FIG. 2, and the block diagram of the SOCc operation unit shown in FIG. 3 are the same in the second embodiment, the explanation thereof is omitted. FIG. 5 is a flowchart showing the processing of the SOCc Big/Small operation unit 501 in the second embodiment. The calculation method of SOC_Big and SOC_Small is different from the flowchart shown in FIG. 4 of the first embodiment.

While the determination threshold (SOCc_th1) of the determination threshold storage unit 505 was used as the threshold for determining the size of the SOCc term operation result in the first embodiment, it is used in the second embodiment for allocating SOC_th1 into a group of values obtainable only in big numerical positions and a group of values obtainable only in small numerical positions based on the numerical position of the operation result of each SOCc term. In other words, values obtainable only in big numerical positions are treated as values of the SOCc_Big addition unit, and values obtainable only in small numerical positions are treated as values of the SOCc_Small addition unit. For example, when SOCc_th1=1, numerical positions of equal to or greater than 1 in SOCc_th1 and numerical positions smaller than 1 in SOCc_th1 are respectively allocated to the addition target of SOCc_Big and SOCc_Small. For example, when the operation result of the SOCc term=12.345, value of the SOCc_Big addition unit=12 and value of the SOCc_Small addition unit=0.345 can be obtained. When SOCc_th1=0.1, value of the SOCc_Big addition unit=12.3 and value of the SOCc_Small addition unit=0.045 are obtained.

In step S200 of FIG. 5, an initial value is assigned to SOCc_Big and SOCc_Small. In step S201, an SOCc term that has not yet undergone determination processing among the respective SOCc terms is assigned to determination target SOCc_Jdg. In step S202, the foregoing value of the SOCc_Big addition unit is assigned to SOCc_Jdg_Big based on SOCc_th1.

In step S203, the foregoing value of the SOCc_Small addition unit is calculated and assigned to SOCc_Jdg_Small by using Formula (12). This is possible because the operation result of each SOCc term is expressed as the sum of the values of the SOCc_Big addition unit and the SOCc_Small addition unit.

$$SOCc\_Jdg\_Small = SOCc\_Jdg - SOCc\_Jdg\_Big \quad \text{Formula (12)}$$

In step S204, the value SOCc_Jdg_Big of the SOCc_Big addition unit is added to SOCc_Big.

In step S205, the value SOCc_Jdg_Small of the SOCc_Small addition unit is added to SOCc_Small.

In step S206, whether there is any undetermined SOCc term (SOCc term that has not yet undergone determination processing) among the seven SOCc terms (1) to (7) is determined. If there is an undetermined SOCc term, steps S201 to S206 are repeated to the undetermined term. Moreover, when there is no longer any undetermined term, the processing is ended.

In this embodiment, the output SOCc_th1 of the determination threshold storage unit 505 is calculated based on the numerical position of determination target values using the SOCc_Big addition unit derivable only with numerical positions of a value equal to or greater than SOCc_th1 and the SOCc_Small addition unit derivable only with numerical positions of a value smaller than SOCc_th1. Moreover, the values of the SOCc_Big addition unit calculated from each SOCc term are totaled to calculate SOCc_Big, and the values of the SOCc_Small addition unit calculated from each SOCc term are totaled to calculate SOCc_Small.

Similar to the first embodiment, by calculating SOCc_Big and SOCc_Small and using SOCc_Big_z and SOCc_Small_z with minimal error caused by information loss, this embodiment is also able to prevent the accumulation of errors caused by information loss which occurred during the repeated SOCc operations.

Third Embodiment

The third embodiment is now explained. Since the block diagram of the configuration of the battery system shown in FIG. 1 and the block diagram of the battery control unit shown in FIG. 2 are the same in the third embodiment, the explanation thereof is omitted. In this embodiment, the configuration of the SOCc operation unit 153' is different from the first embodiment.

Figure 6:
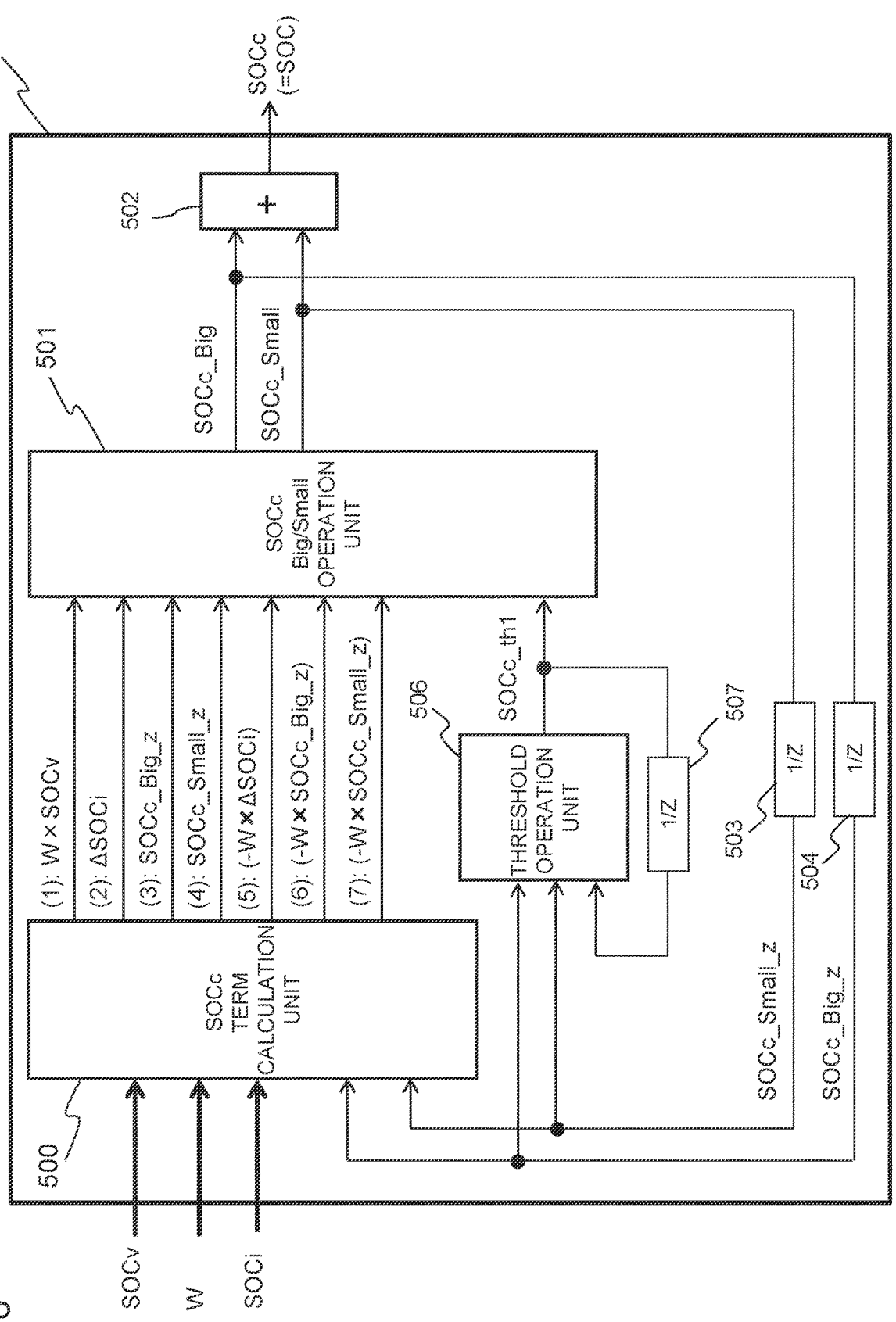
FIG. 6 is a block diagram of the SOCc operation unit in the third embodiment.

FIG. 6 is a block diagram of the SOCc operation unit 153' in the third embodiment. The same parts as the SOCc operation unit 153 shown in the first embodiment are given the same reference numeral and the explanation thereof is omitted. While the determination threshold SOCc_th1 was a fixed value in the first embodiment, the determination threshold SOCc_th1 is dynamically changed in this embodiment.

The threshold operation unit 506 uses SOCc_Big_z, SOCc_Small_z, and output SOCc_th1_z of the previous operation period of the threshold operation unit 506 as the inputs, and outputs the determination threshold SOCc_th1. The previous threshold holding unit 507 retains SOCc_th1 of the present operation period, and calculates SOCc_th1 of the previous operation period (this is hereinafter referred to as "SOCc_thh1_z") in the subsequent operation period.

FIG. 7 is a flowchart showing the processing of the threshold operation unit 506 in the third embodiment.

In step S300, the ratio SOCc_th1_ratio is calculated from SOCc_Big_z and SOCc_Small_z based on Formula (13).

$$SOCc\_th1\_ratio = SOCc\_Small\_z / SOCc\_Big\_z \quad \text{Formula (13)}$$

In step S301, the size of the ratio SOCc_th1_ratio and the size of a predetermined determination threshold SOCc_th2 are determined. When the ratio SOCc_th1_ratio is greater than the determination threshold SOCc_th2; that is, when Formula (14) below is complete, the processing of step S302 is performed. The determination threshold SOCc_th2 is a determination threshold for determining that SOCc_Small_z is now extremely close to SOCc_Big_z. When SOCc_Small_z includes an SOCc term value that is a large value, the ratio SOCc_th1_ratio will be greater than SOCc_th2.

$$SOCc\_th1\,ratio > SOCc\_th2 \quad \text{Formula (14)}$$

In step S302, SOCc_th1 of the present operation period is calculated based on Formula (15) by multiplying a gain value W1_SOCc_th1 (W1_SOCc_th1<1) set to be a value that is smaller than SOCc_th1 (SOCc_th_1_z) of the previous operation period.

$$SOCc\_th1 = SOCc\_th1\_z \times W1\_SOCc\_th1 \qquad \text{Formula (15)}$$

In step S301, when Formula (14) is incomplete, the processing of step S304 is performed. In step S304, the size of the ratio SOCc_th1_ratio and the size of a predetermined determination threshold SOCc_th3 are determined. In other words, when Formula (16) is complete, the processing of step S303 is performed. The determination threshold SOCc_th3 is a determination threshold for determining that SOCc_Small_z is a value that is extremely smaller than SOCc_Big_z. When SOCc_Small_z does not include an SOCc term value that is a large value, the ratio SOCc_th1_ratio will be smaller than SOCc_th3.

$$SOCc\_th1\_ratio < SOCc\_th3 \qquad \text{Formula (16)}$$

In step S303, SOCc_th1 of the present operation period is calculated based on Formula (17) by multiplying a gain value W2_SOCc_th1 (W2_SOCc_th1>1) set to be a value that is larger than SOCc_th1 (SOCc_th_1_z) of the previous operation period.

$$SOCc\_th1 = SOCc\_th1\_z \times W2\_SOCc\_th1 \qquad \text{Formula (17)}$$

In step S304, when Formula (16) is incomplete, step S305 is performed. In other words, step S305 is the processing performed when Formula (18) is satisfied.

$$SOCc\_th3 \leq SOCc\_th1\_ratio\ SOCc\_th2 \qquad \text{Formula (18)}$$

In step S305, as shown in Formula (19), SOCc_th1_z is directly assigned to SOCc_th1 of the present operation period, and values are not updated.

$$SOCc\_th1 = SOCc\_th1\_z \qquad \text{Formula (19)}$$

In this embodiment, the increase in the SOCc_th1_ratio is determined in step S301 based on the determination threshold SOCc_th2, and the fact that SOC_Small includes an SOCc term of a large value is thereby detected. While SOCc_Small will have minimal error caused by information loss while it is a sum of the SOCc term of a small value, the error will increase when an SOCc term of a large value exists in the sum. In order to solve this problem, considered may be removing the SOCc term of a large value from SOCc_Small and transferring it to SOCc_Big. When the increase in SOCc_th1_ratio is determined based on the determination threshold SOCc_th2, the gain value W1_SOCc_th1 is used to decrease SOCc_th1 of the present operation period. It is thereby possible to transfer the SOCc term of a large value included in SOCc_Small of the present operation period to SOCc_Big, more quickly than SOCc_th1 of a fixed value, based on a smaller determination threshold SOCc_th1.

Nevertheless, when the SOCc term of a large value is excluded from the sum target of SOCc_Small, an SOCc term of a small value tends to become included in SOCc_Big when the determination threshold SOCc_th1 of a small value is maintained and, in the foregoing case, error of SOCc_Big caused by information loss may increase.

Thus, when SOCc_th1_ratio becomes smaller than the determination threshold SOCc_th3, the gain value W2_SOCc_th1 is used to perform processing for increasing the determination threshold SOCc_th1.

Moreover, when SOCc_th1_ratio is within the range of the determination threshold SOCc_th3 and the determination threshold SOCc_th2, it is determined that there is no need to change SOCc_th1, and the values are not updated from SOCc_th1_z.

In this embodiment, while the threshold operation unit 506 calculates SOCc_th1 of the present operation period by using SOCc_Big_z, SOCc_Small_z and the determination threshold SOCc_th1 (SOCc_th1_z) of its previous operation period, the calculation may also be performed dynamically by using parameters related to other battery estimation states. Moreover, similar to SOCc_Big_z and SOCc_Small_z, as SOCc_th1_z, the values stored in a non-volatile memory equipped in the storage unit 180 may also be used in addition to the retained values periodically operated in succession.

According to this embodiment, similar to the first embodiment and the second embodiment, by calculating SOCc_Big and SOCc_Small and using SOCc_Big_z and SOCc_Small_z with minimal error caused by information loss, this embodiment is also able to prevent the accumulation of errors caused by information loss which occurred during the repeated SOCc operations. In this embodiment, since the determination threshold SOCc_th1 is dynamically changed and SOCc_Big and SOCc_Small are appropriately calculated, even when the SOCc fluctuates, it is possible to reliably prevent the accumulation of errors caused by information loss.

According to the embodiments explained above, the following operation and effect are yielded.

(1) A battery control unit 150 comprises an SOCc term calculation unit 500 which divides an operation of a state of charge of a battery into a plurality of terms and operates each term, an SOCc Big/Small operation unit 501 which divides an operation result of each term operated by the SOCc term calculation unit 500 into a plurality of groups based on a predetermined threshold and totals the operation result for each group, and previous value holding units 503, 504 which respectively store, as previous values, the operation result for each group totaled in a previous operation period by the SOCc Big/Small operation unit 501, wherein the SOCc term calculation unit 500 operates each term using the previous value of each group stored in the previous value holding units 503, 504. It is thereby possible to suppress the operational error of the SOC caused by information loss.

Modified Examples

The present invention can also be worked by modifying the foregoing first to third embodiments in the following manner.
(1) While the embodiments explained a case of dividing the SOCc term into the two groups of SOCc_Big and SOCc_Small, the SOCc term may also be divided into three or more groups based on a plurality of thresholds. Subsequently, each term of the SOCc term is totaled for each group divided into three or more groups, and the operation result of each group that was totaled is retained as a previous value for each group. The retained previous value is used in a subsequent operation period.

The present invention is not limited to the foregoing embodiments, and other modes considered to fall within the scope of the technical concept of the present invention are also included in the scope of the present invention so as long as they do not impair the characteristics of the present invention. Moreover, the present invention may also be configured by combining each of the foregoing embodiments and modified examples.

REFERENCE SIGNS LIST 100 battery system
110 assembled battery 120 measurement unit
130 current detection unit
140 voltage detection unit
150 battery control unit
151 SOCv operation unit
152 ΔSOCi operation unit
153 SOCc operation unit
154 weight operation unit
180 storage unit
200 vehicle control unit
300, 310 relay
400 inverter
410 motor generator
500 SOCc term calculation unit
501 SOCc Big/Small operation unit
502 addition unit
503, 504 previous value holding unit
505 determination threshold storage unit
506 threshold operation unit
507 previous threshold holding unit

The invention claimed is:

1. A battery control device, comprising:
a first operation unit coupled with a battery via an insulative element, the first operation unit configured to receive, from a measurement unit associated with the battery during a first operation period of the battery, a plurality of terms regarding a state of charge of the battery and determine an operation result of each of the plurality of terms;
a second operation unit configured to receive, from the first operation unit during the first operation period of the battery, the operation result of each of the plurality of terms operated by the first operation unit and group the operation result of each of the plurality of terms into a large group and a small group based on a first threshold value and total the operation result for the large group and the operation result for the small group, wherein the totaled operation result for the large group and the totaled operation result for the small group respectively include a previous totaled operation result for the large group and a previous totaled operation result for the small group;
a threshold operation unit operatively coupled to the second operation unit, the threshold unit configured to determine a second threshold value and provide the second threshold value to the second operation unit, the second threshold value based on the first threshold value, the totaled operation result for the large group, and the totaled operation result for the small group; and
a storage unit comprising a first non-volatile memory configured to store the totaled operation result for the large group in place of the previous totaled operation result for the large group prior to termination of the first operation period of the battery, a second non-volatile memory configured to store the totaled operation result for the small group in place of the previous totaled operation result for the small group prior to termination of the first operation period of the battery, and a third non-volatile memory configured to store the first threshold value prior to termination of the first operation period of the battery,
wherein, during a second operation period of the battery, the storage unit is configured to provide the totaled operation result for the large group and the totaled operation result for the small group to the first operation unit, wherein, during the second operation period of the battery, the first operation unit determines an operation result for one or more second terms using the received totaled operation result for the large group and the received totaled operation result for the small group,
wherein, during the second operation period of the battery, the second operation unit receives, from the first operation unit, the totaled operation result for the large group and the totaled operation result for the small group,
wherein, during the second operation period of the battery, threshold operation unit provides the second threshold value to the second operation unit, and
wherein the battery control device is configured to determine the state of charge of the battery based on the totaled operation result for the large group and the totaled operation result for the small group and provide the state of charge of the battery to a vehicle control unit, the vehicle control unit configured to determine a distribution of a driving force based on the state of charge of the battery.

2. The battery control device according to claim 1, wherein the first operation unit divides the operation of the state of charge of the battery into the plurality of terms, not including addition or subtraction.

3. The battery control device according to claim 1, further comprising:
a third operation unit configured to receive, from the second operation unit, the totaled operation result for the large group and the totaled operation result for the small group,
the third operation unit configured to add the totaled operation result for the large group and the totaled operation result for the small group and output a result as a current state of charge of the battery.

4. The battery control device according to claim 1, wherein:
the first operation period includes a point of time that the battery control device ends its operation.

5. The battery control device according to claim 1, further comprising one or more among:
an SOCv operation unit coupled with the battery and configured to calculate the state of charge of the battery by using an end-to-end voltage of the battery;
a ΔSOCi operation unit coupled with the battery and configured to calculate an amount of change of the state of charge of the battery obtained by integrating a current flowing through the battery from a previous operation period; and
a weight operation unit coupled with the battery and configured to perform a weighting operation, by using a weighting factor, to the states of charge of the battery calculated respectively by the SOCv operation unit and the ΔSOCi operation unit,
wherein, during the first operation period of the battery, the first operation unit determines the operation result for each of the plurality of terms using values output from one or more among the SOCv operation unit, the ΔSOCi operation unit, and the weight operation unit.

6. The battery control device according to claim 5, wherein, during the second operation period of the battery, the first operation unit determines the operation result for each of the plurality of terms using values output from one or more among the SOCv operation unit, the ΔSOCi operation unit, and the weight operation unit, the totaled operation result of the large group stored in the first non-volatile memory of the storage unit, and the totaled operation result of the small group stored in the second non-volatile memory of the storage unit.

7. The battery control device according to claim 1, wherein
at least one of the first operation unit or the second operation unit includes a floating-point operation.

8. The battery control device according to claim 1, wherein
at least one of the first operation unit or the second operation unit includes a 32-bit floating-point operation.

9. The battery control device according to claim 1,
wherein the second operation unit groups, based on a numerical position designated with the first threshold value, the operation result of each of the plurality of terms into the large group consisting of values of a large numerical position equal to or greater than the numerical position and the small group consisting of values of a numerical position smaller than the numerical position.

10. The battery control device according to claim 1,
wherein the threshold operation unit determines the second threshold value based on a ratio of the totaled operation result of the large group and the totaled operation result of the small group.

11. The battery control device according to claim 10,
wherein the threshold operation unit sets the second threshold value to be small relative to the first threshold value when the totaled operation result of the small group increases relative to a previous totaled operation result of the small group.

* * * * *